(12) United States Patent
Rylyakov et al.

(10) Patent No.: US 7,352,297 B1
(45) Date of Patent: Apr. 1, 2008

(54) METHOD AND APPARATUS FOR EFFICIENT IMPLEMENTATION OF DIGITAL FILTER WITH THERMOMETER-CODE-LIKE OUTPUT

(75) Inventors: Alexander V. Rylyakov, Mount Kisco, NY (US); Jose A. Tierno, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/673,134

(22) Filed: Feb. 9, 2007

(51) Int. Cl.
*H03M 7/00* (2006.01)

(52) U.S. Cl. .................. 341/50; 327/156; 327/157; 331/1 A; 331/16; 331/17; 331/25; 331/36 C; 375/327; 375/375; 375/376

(58) Field of Classification Search .......... 341/50; 327/156, 157; 331/1 A, 16, 17, 25, 36 C, 331/177 V, 179; 375/327, 375, 376
See application file for complete search history.

(56) References Cited

U.S. PATENT DOCUMENTS

| | | | | |
|---|---|---|---|---|
| 6,310,653 | B1* | 10/2001 | Malcolm et al. | 348/537 |
| 6,414,555 | B2* | 7/2002 | Staszewski et al. | 331/18 |
| 6,658,748 | B1* | 12/2003 | Leipold et al. | 331/179 |
| 6,961,013 | B2* | 11/2005 | Lin et al. | 341/155 |
| 7,046,098 | B2* | 5/2006 | Staszewski | 331/158 |
| 2007/0222526 | A1* | 9/2007 | Mayer et al. | 331/34 |

* cited by examiner

*Primary Examiner*—Khai M. Nguyen
(74) *Attorney, Agent, or Firm*—Anne V. Dougherty; Ryan, Mason & Lewis, LLP

(57) ABSTRACT

A technique is disclosed for processing a binary coded signal to generate a thermometer coded signal. Such technique includes the following steps. A binary coded input signal is obtained. A binary arithmetic operation is performed on a least significant bit (LSB) portion of the binary coded input signal. At least one signal representative of an occurrence of one of an overflow condition and an underflow condition is generated, in response to the binary arithmetic operation performed on the LSB portion. A thermometer coded signal is shifted in response to the signal representative of the occurrence of one of the overflow condition and the underflow condition, wherein shifting of the thermometer coded signal represents one of incrementing and decrementing a most significant bit (MSB) portion of the binary coded input signal. The thermometer coded signal is outputted. Performance of the binary arithmetic operation on the LSB portion of the binary coded input signal and shifting of the thermometer coded signal in response to one of the overflow condition and the underflow condition results in elimination of a sign extension into the MSB portion of the binary coded input signal.

17 Claims, 6 Drawing Sheets

METHOD AND APPARATUS FOR EFFICIENT IMPLEMENTATION OF DIGITAL FILTER WITH THERMOMETER-CODE-LIKE OUTPUT

FIELD OF THE INVENTION

The present invention relates generally to the design of digital filters for signal processing and specifically to techniques for implementing improved digital filters with a thermometer-code-like output.

BACKGROUND OF THE INVENTION

There are many useful circuits that require an arithmetic operation (e.g., an addition operation) followed by a conversion to a thermometer code or the like. Such circuits can, for example, serve as the last stage before a digital to analog converter (DAC), or the loop filter in a digital phase locked loop (DPLL) or digital delay locked loop (DDLL). While binary arithmetic is efficient at computing numbers, thermometer codes are known to have advantageous properties when it comes to interfacing to analog systems.

The main advantage of the thermometer code is that it is monotone, i.e., between individual codes, there exists only a transition of one bit from one code state (e.g., zero) to the other code state (e.g., one). For example, given a three-bit binary code transition from 011 (decimal 3) to 100 (decimal 4) wherein one bit transitions from zero to one and other bits transition from one to zero, the corresponding thermometer code transition may be 00000111 to 00001111. Since only one bit transitions from a zero to a one in the thermometer code, less errors typically would occur in any output signal that the thermometer code may represent (e.g., a frequency or phase signal), thus yielding an advantage in the thermometer code as compared with the binary code.

FIG. 1 shows a phase correction portion of a conventional DPLL, typically used by a digital data receiver in a communication system. As is known, a DPLL circuit typically includes a serial shift register which receives digital input samples (extracted from a signal received from a digital data transmitter), a stable local clock signal which supplies clock pulses to the shift register to drive it, and a phase correction circuit which takes the local clock and regenerates a stable clock in phase with the received signal by adjusting the phase of the regenerated clock to match the received signal. The regenerated clock signal is then used to sample the received data and determine the value of each received bit. When a signal is first received, the regenerated clock and the received signal will not be aligned. The loop therefore starts to track the received signal, and eventually locks-in to the required signal, allowing it to find the center of each received data bit, and reliably decode the received information.

A loop filter is used by the phase correction circuit of the DPLL to compute the new frequency that is required by the input, on a cycle by cycle basis. An error signal is passed to the loop filter. The error signal may be representative of a frequency error and/or a phase error. Frequency error is a representation of whether the reference frequency is higher or lower than the output frequency of the DPLL, and optionally by what amount it is higher or lower. Phase error is a representation of whether the reference clock edge arrived earlier or later than the output clock edge, and optionally by what amount.

Arithmetic implementation of a digital loop filter is typically performed in binary, and the result is separated into most significant bits (MSB) and least significant bits (LSB). That is, as shown in FIG. 1, the digital filter has an MSB filter component 102 and an LSB filter component 104.

The MSB portion of the loop filter output is encoded as two groups of thermometer codes in binary-to-thermometer encoder 106, which are sent to digitally controlled oscillator (DCO) array 110. As is known, the two groups of thermometer codes are used for row and column control of the DCO. Note that encoder 106 outputs two sets of $2^{N/2}$ bits, where N is the number of bits in the MSB. This is a reduction from a straightforward thermometer code representation, that would require a set of $2^N$ bits (for N=8, we reduce from 256 bits to 16+16=32 bits). This reduction is a standard technique that is commonly used. The LSB portion of the loop filter output is further encoded using sigma delta (SD) encoder 108, and sent to the DCO as a dithering signal.

However, there are several problems with the above-described DPLL implementation. First, arithmetic operations need to be done at the full resolution of the filter, however, the error signal is usually very small. Second, binary-to-thermometer encoders are relatively large in size, and require a significant amount of fan-out from the input signals. Further, the fan-out increases exponentially with the magnitude of the input, and therefore does not scale well for larger codes. Still further, the conversion to thermometer code can not start until the arithmetic computation is completed, thus potentially increasing the latency inside the DPLL control loop. This increased latency may have negative effects on the stability of the closed loop.

Accordingly, it would be desirable to provide improved techniques for processing a binary coded signal to generate a thermometer coded signal.

SUMMARY OF THE INVENTION

Principles of the invention provide improved techniques for processing a binary coded signal to generate a thermometer coded signal.

For example, in one aspect of the invention, a technique includes the following steps. A binary coded input signal is obtained. A binary arithmetic operation is performed on a least significant bit (LSB) portion of the binary coded input signal. At least one signal representative of an occurrence of one of an overflow condition and an underflow condition is generated, in response to the binary arithmetic operation performed on the LSB portion. A thermometer coded signal is shifted in response to the signal representative of the occurrence of one of the overflow condition and the underflow condition, wherein shifting of the thermometer coded signal represents one of incrementing and decrementing a most significant bit (MSB) portion of the binary coded input signal. The thermometer coded signal is outputted.

Performance of the binary arithmetic operation on the LSB portion of the binary coded input signal and shifting of the thermometer coded signal in response to one of the overflow condition and the underflow condition results in elimination of a sign extension into the MSB portion of the binary coded input signal.

The binary coded input signal may represent an error signal in a digital phase locked loop circuit. In such case, the binary arithmetic operation may be performed in a loop filter. The thermometer coded signal may represent one or more thermometer codes used to control a digitally controlled oscillator (DCO), such that the DCO outputs a corrected clock signal that is useable to decode digital data received by a receiver. Further, an output of the loop filter may be provided to a sigma delta encoder which generates a dithering signal useable by the DCO.

Advantageously, such improved techniques reduce the complexity and latency associated with performing binary arithmetic followed by thermometer code conversion.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

While principles of the invention will be described below in the context of a loop filter of a digital phase locked loop (DPLL) implementation, it is to be understood that the invention is more generally applicable to any implementation of a digital filter with a thermometer-code-like output. That is, principles of the invention advantageously provide techniques for performing binary arithmetic followed by thermometer code conversion.

Figure 1:
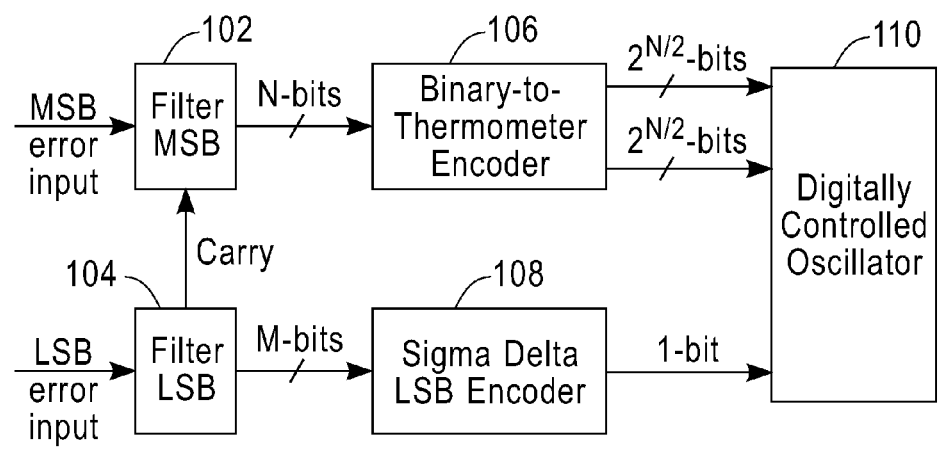
FIG. 1 illustrates a conventional phase correction portion of a digital phase locked loop.
Figure 2:
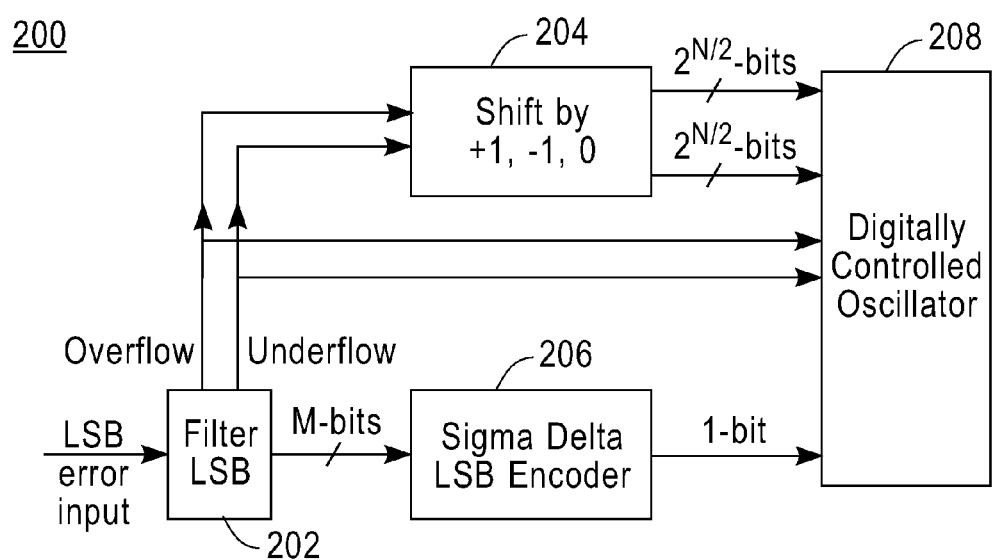
FIG. 2 illustrates a phase correction portion of a digital phase locked loop, according to an embodiment of the invention.

FIG. 2 illustrates a portion of a digital phase locked loop, according to an embodiment of the invention. That is, the figure shows one example of how principles of the invention may be implemented in a system that performs binary arithmetic followed by thermometer code conversion, i.e., the DPLL system of FIG. 2.

Principles of the invention realize that, since the error signal input to a DPLL circuit is usually relatively small (e.g., about 0.1% to 1% of the range of the filter), instead of sign-extending the error to the full resolution of the loop filter, the arithmetic operation can be limited to the LSB portion of the filter. Advantageously, the LSB accommodates all the significant bits of the error signal, and eliminates sign extension into the MSB filter part.

Thus, in DPLL 200 of FIG. 2, the LSB arithmetic (LSB filter 202) is augmented with underflow/overflow logic. In an adder, an overflow signal corresponds to the CarryOut signal being asserted and the short addend is positive. An underflow signal corresponds to the CarryOut signal not being asserted and the short addend is negative. Each signal may be implemented with a two input logic gate.

In addition to outputting M bits to SD LSB encoder 206 to yield a dithering signal that is then sent to DCO 208, LSB filter 202 also generates overflow/underflow signals. "Overflow" asserted means that the current operation would have resulted in the MSB increasing by one. "Underflow" asserted means that the current operation would have resulted in the MSB decreasing by one. Both "underflow" and "overflow" negated means that the current operation results in no change to the MSB. For example, in the case of an addition, overflow occurs when a positive number is added to the LSB, and carry out is asserted. Underflow occurs when a negative number is added to the LSB, and carry out is negated.

Incrementing and decrementing the MSB is accomplished directly on the thermometer code in block 204. Incrementing the MSB corresponds to shifting the code to the right, with a '1' being shifted in from the right. Decrementing the MSB corresponds to shifting the code to the left, with a '0' being shifted in from the left. If neither underflow nor overflow is asserted, the DCO control logic can be gated off. This strategy also implements saturation of the MSB. That is, the MSB does not wrap around when incremented past the maximum value or decremented past the minimum value. Saturation is usually what is needed for this particular type of application.

It is to be understood that the thermometer code that is incremented and decremented is stored in a register. This register is reset to a valid state, and from then on it gets shifted left or right and stays as a valid thermometer code. Below is a table illustrating an example of thermometer code shifting:

| Operation | Column[0:3] | Row[0:3] |
|---|---|---|
| Reset | 0000 | 0000 |
| Inc | 1000 | 0000 |
| Inc | 1100 | 0000 |
| Inc | 1110 | 0000 |
| Inc | 1111 | 0000 |
| Inc | 0111 | 1000 |
| Inc | 0011 | 1000 |
| Dec | 0111 | 1000 |

Thus, code shifting block 204 outputs the two groups of thermometer codes to DCO 208 for use in row and column control of the DCO.

One added advantage of the inventive principles is that we know what will happen to the thermometer code one cycle ahead of time. When overflow is asserted, we know that, in the next cycle, one more bit of the thermometer code will be asserted. Thus, we extend the thermometer code by adding two extra bits: one matching "overflow," and one matching "not underflow." The new code, with these two extra bits, has the correct number of bits turned on one cycle ahead of time, thus reducing the latency of the filter. For example:

| Previous Value | Previous code | Ov/Un | Next Value | Next Code |
|---|---|---|---|---|
| 1 | 1000 0000 | 01 | 1 | 1000 0000 |
| 1 | 1000 0000 | 11 | 2 | 1100 0000 |
| 2 | 1100 0000 | 10 | 1 | 1000 0000 |

Given the above description of principles of the invention in the context of FIG. 2, FIGS. 3 through 6 are used below to describe an illustrative DPLL embodiment in which the inventive principles are implemented.

Figure 3:
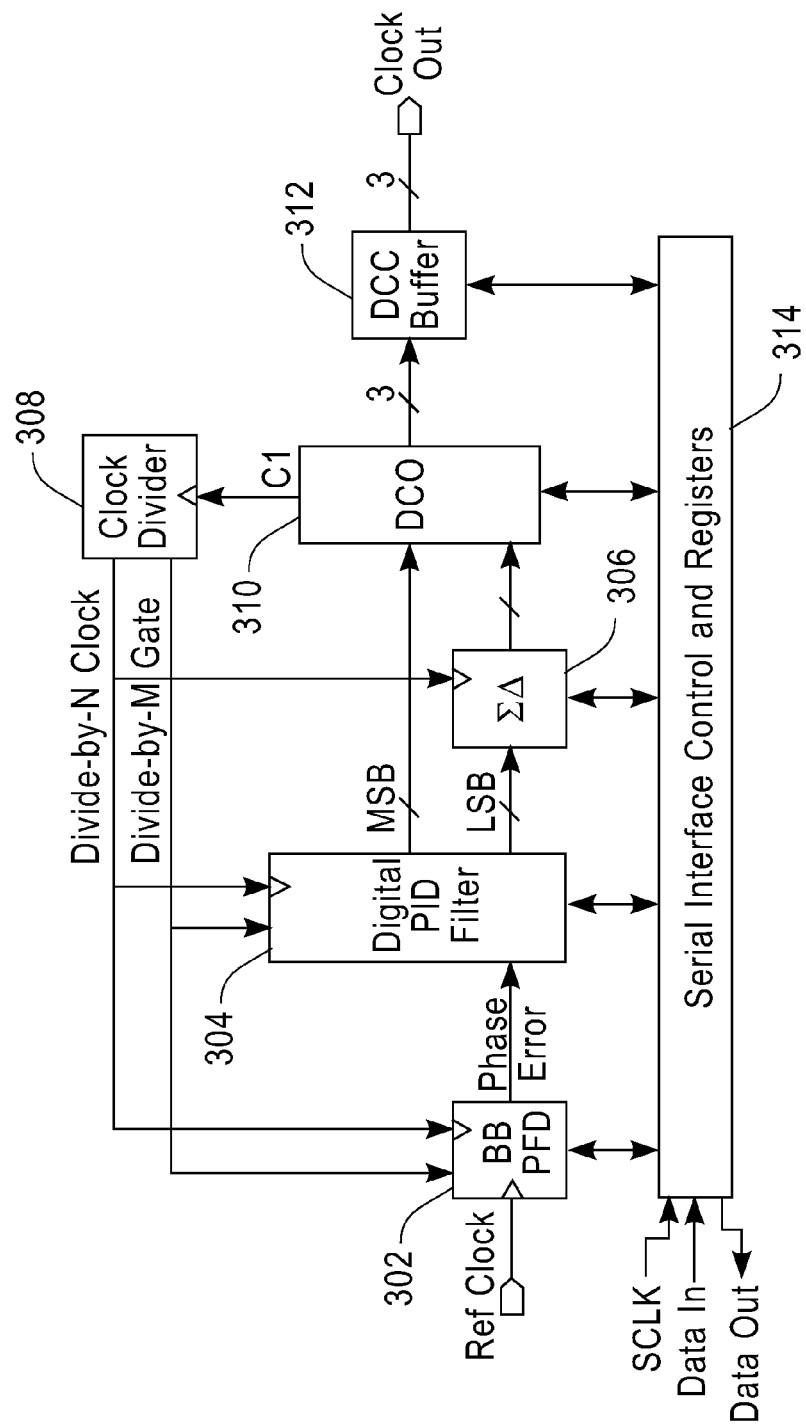
FIG. 3 illustrates an overall digital phase locked loop, according to an embodiment of the invention.

FIG. 3 illustrates a digital phase locked loop, according to an embodiment of the invention. It is to be appreciated that FIG. 3 depicts an overall DPLL circuit.

As shown in FIG. 3, block 302 represents a bang-bang phase and frequency detector. The detector takes two clocks in, the reference clock and the local clock, and outputs a single bit indicating whether the reference clock is ahead of or lags the local clock. Block 304 is a digital implementation of a proportional integral differential (PID) filter. The filter is used to filter the output of the bang-bang phase detector to provide an input suitable for the digitally controlled oscillator.

Block 306 is a sigma delta encoder. The encoder takes the least significant bits of the output of the filter and encodes them into fewer, equally weighted bits to dither the digitally controlled oscillator. Block 308 is a clock divider. The clock divider reduces the frequency of an input clock by an integer amount.

Block 310 is a digitally controlled oscillator (DCO). The DCO takes a digital input, and generates an output clock with a frequency determined by that digital input. Block 312 is a duty cycle correction buffer. The buffer compensates for duty cycle distortion. Block 314 is a serial interface, used to provide configuration and debug inputs for the DPLL.

Figure 4:
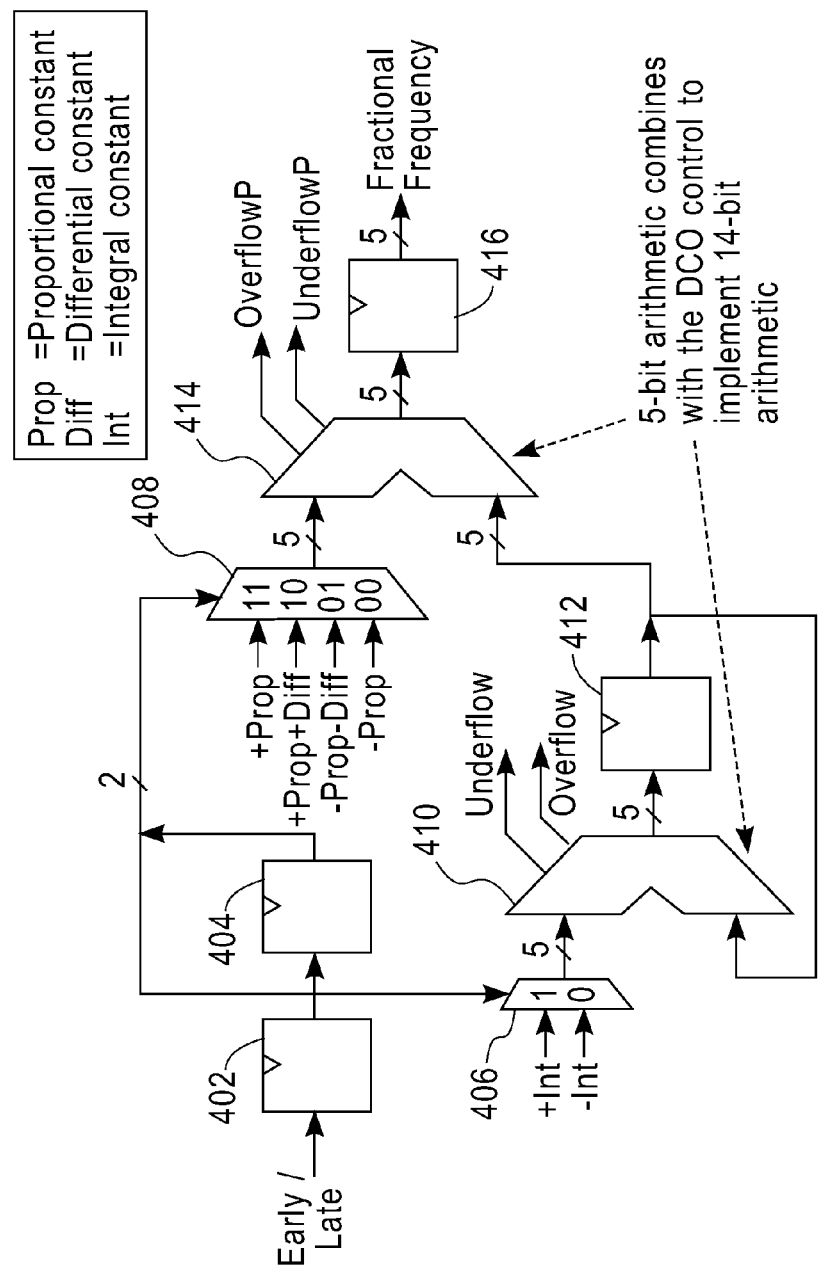
FIG. 4 illustrates a digital loop filter, according to an embodiment of the invention.

FIG. 4 illustrates a digital loop filter, according to an embodiment of the invention. It is to be appreciated that FIG. 4 depicts details of digital loop filter 304 from FIG. 3. As mentioned above, the filter is used to filter the output of the bang-bang phase detector to provide an input suitable for the DCO. As shown, blocks 402, 404, 412 and 416 are flip flops; blocks 406 and 408 are multiplexers; and blocks 410 and 414 are adders. In accordance with the logic shown, the filter receives an Early/Late signal which represents whether the reference clock is ahead of or lags the local clock (this signal is provided by detector 302). The signals labeled "Prop," "Diff," and "Int" are, respectively, the proportional, differential and integral constants of the PID filter. "Overflow" and "Underflow" signals are accumulated in the row and column control of the DCO. "OverflowP" and "UnderflowP" come from the differential/proportional path, and are applied for one cycle to the DCO, but are not accumulated. The signal output by adder 414 represents the LSB portion of the filter output. The signal is called a "fractional frequency" because the DCO can only create discrete frequencies, and the LSB represents an interpolation between those discrete frequencies, therefore it is referred to as a fractional frequency.

Figure 5:
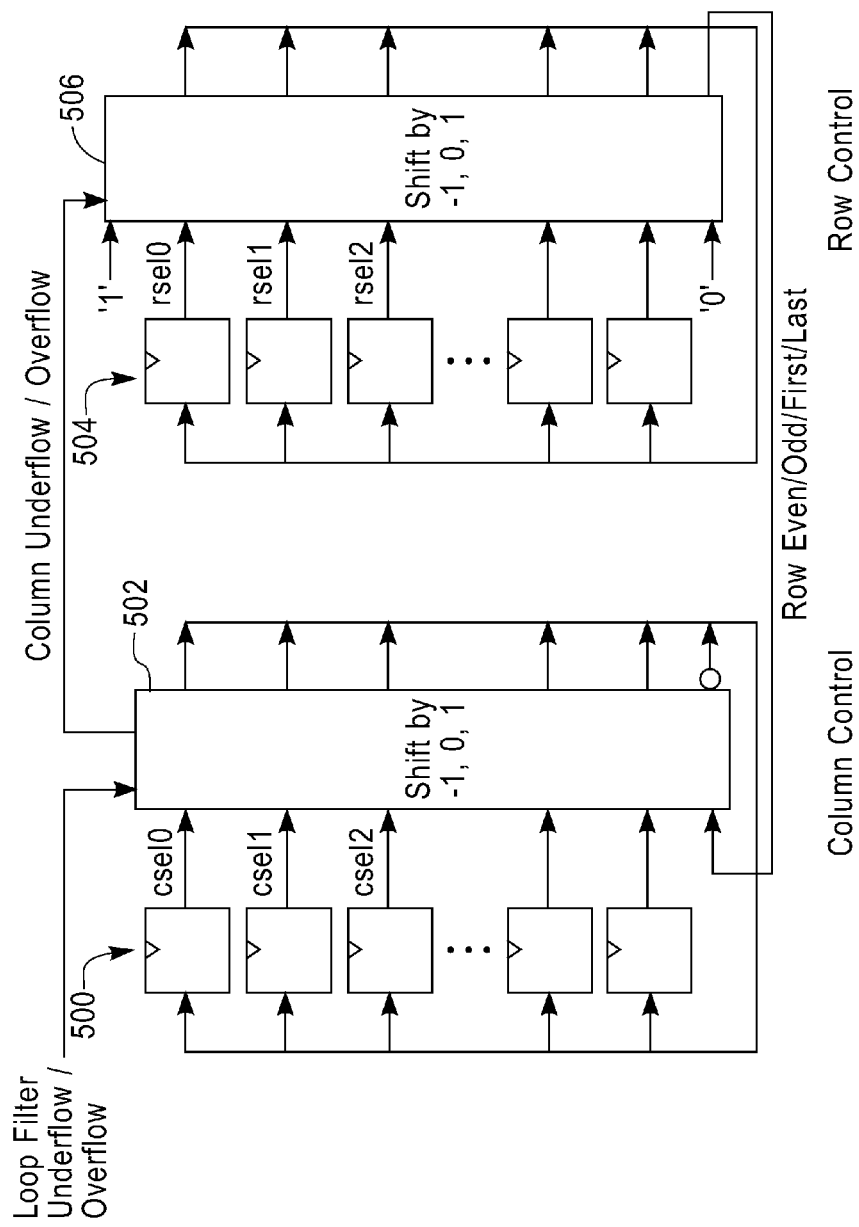
FIG. 5 illustrates a code shifting unit, according to an embodiment of the invention.

FIG. 5 illustrates a code shifting unit, according to an embodiment of the invention. It is to be appreciated that FIG. 5 depicts details of code shifting block 204 from FIG. 2. In terms of FIG. 3, such code shifting functions are integrated with the DCO (as illustrated below in the context of FIG. 6). However, principles of the invention are not limited to such an arrangement.

Reference numeral 500 represents the set of flip-flops (register) used for column control, while block 502 is a left and right shifter for the column control. Shifter 502 will shift thermometer code stored in register 500 left, right or not at all according to the underflow or overflow input from the loop filter. Reference numeral 504 represents the set of flip-flops (register) used for row control, while block 506 is a left and right shifter for the row control. Shifter 506 will shift thermometer code stored in register 504 left, right, or not at all according to the underflow or overflow input from the column shifter.

Figure 6:
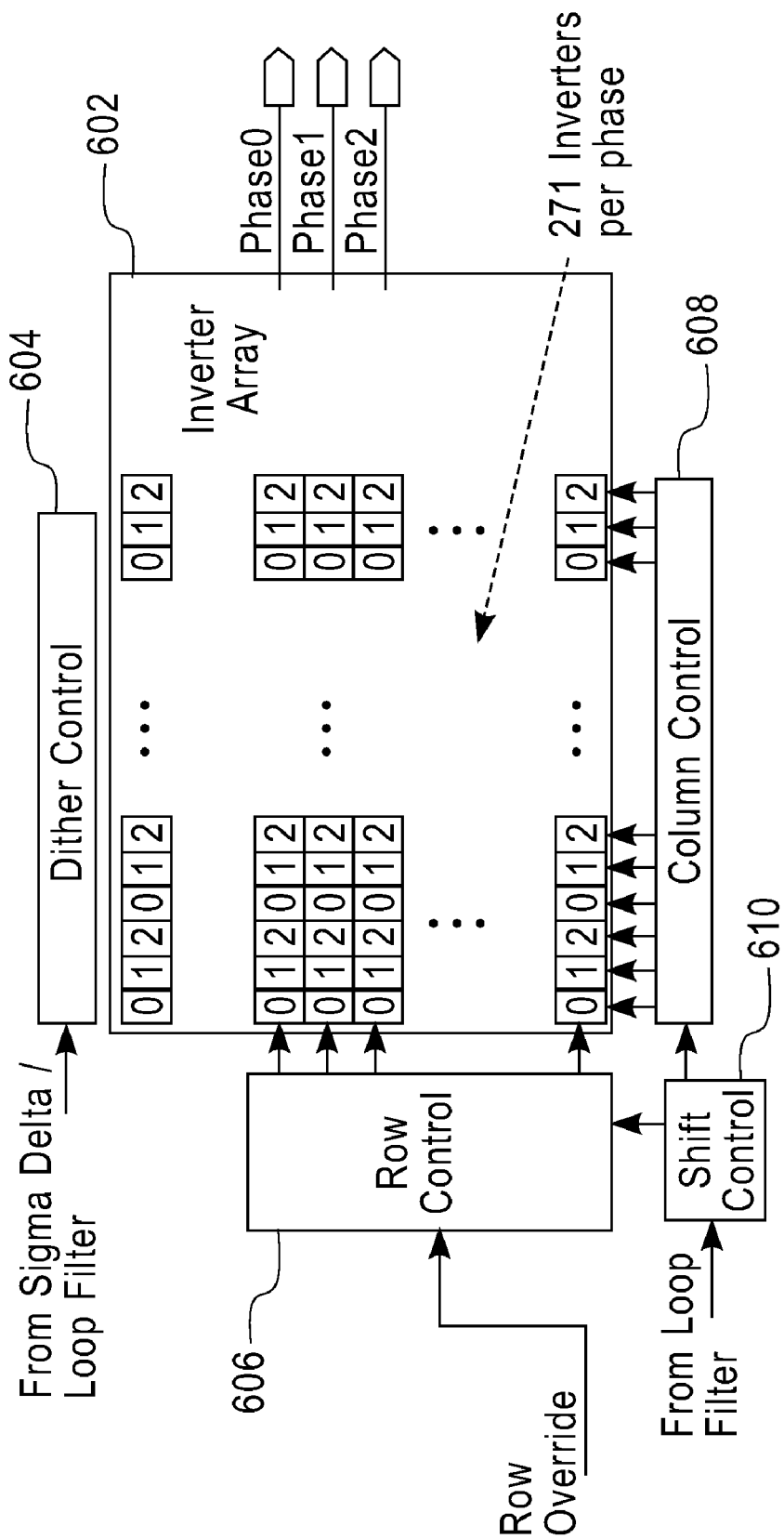
FIG. 6 illustrates a digitally controlled oscillator, according to an embodiment of the invention.

FIG. 6 illustrates a digitally controlled oscillator, according to an embodiment of the invention. It is to be appreciated that FIG. 6 depicts details of DCO 310 from FIG. 3. As shown, block 602 is an array of tri-state inverters connected in three banks (0, 1 and 2) that implements a programmable ring oscillator, and is controlled by the row and column control. Block 604 uses the output of the sigma delta encoder of (block 306 of FIG. 3) to dither the output frequency of the ring oscillator. Block 606 represents the row control shifter (506) and flip-flops (504) as illustrated in more detail in FIG. 5. Block 608 represents the column control shifter (502) and flip-flops (500) as illustrated in more detail in FIG. 5. Block 610 represents glue logic between the column and row control. As explained above, the DCO takes a digital input, and generates an output clock with a frequency determined by that digital input. That is, depending on the array bank selected, "phase 0," "phase 1," or "phase 2" is output by the DCO.

It is to be appreciated that while specific embodiments of principles of the invention have been provided and explained above, such inventive principles may be implemented by any suitable form of memory and processing circuitry, for example, one or more digital signal processors with associated memory, application specific integrated circuit(s), one or more appropriately programmed general purpose digital computers with associated memory. In the case of a processor-based implementation, principles of the invention may be implemented as program code that can be loaded from memory and executed by one or more processors. One of ordinary skill in the art will contemplate various other ways of implementing principles of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method of processing a binary coded signal to generate a thermometer coded signal, comprising the steps of:
   obtaining a binary coded input signal;
   performing a binary arithmetic operation on a least significant bit (LSB) portion of the binary coded input signal;
   generating at least one signal representative of an occurrence of one of an overflow condition and an underflow condition, in response to the binary arithmetic operation performed on the LSB portion;
   shifting a thermometer coded signal in response to the signal representative of the occurrence of one of the overflow condition and the underflow condition, wherein shifting of the thermometer coded signal represents one of incrementing and decrementing a most significant bit (MSB) portion of the binary coded input signal; and
   outputting the thermometer coded signal.

2. The method of claim 1, wherein performing the binary arithmetic operation on the LSB portion of the binary coded input signal and shifting the thermometer coded signal in response to one of the overflow condition and the underflow condition results in elimination of a sign extension into the MSB portion of the binary coded input signal.

3. The method of claim 1, wherein the binary coded input signal represents an error signal in a digital phase locked loop circuit.

4. The method of claim 3, wherein the binary arithmetic operation is performed in a loop filter.

5. The method of claim 4, wherein the thermometer coded signal represents one or more thermometer codes used to control a digitally controlled oscillator (DCO), such that the DCO outputs a corrected clock signal that is useable to decode digital data received by a receiver.

6. The method of claim 5, wherein an output of the loop filter is provided to a sigma delta encoder which generates a dithering signal useable by the DCO.

7. Apparatus for processing a binary coded signal to generate a thermometer coded signal, comprising:

a memory; and a processor coupled to the memory and operative to: (i) obtain a binary coded input signal; (ii) perform a binary arithmetic operation on a least significant bit (LSB) portion of the binary coded input signal; (iii) generate at least one signal representative of an occurrence of one of an overflow condition and an underflow condition, in response to the binary arithmetic operation performed on the LSB portion; (iv) shift a thermometer coded signal in response to the signal representative of the occurrence of one of the overflow condition and the underflow condition, wherein shifting of the thermometer coded signal represents one of incrementing and decrementing a most significant bit (MSB) portion of the binary coded input signal; and (v) output the thermometer coded signal.

8. The apparatus of claim 7, wherein performing the binary arithmetic operation on the LSB portion of the binary coded input signal and shifting the thermometer coded signal in response to one of the overflow condition and the underflow condition results in elimination of a sign extension into the MSB portion of the binary coded input signal.

9. The apparatus of claim 7, wherein the binary coded input signal represents an error signal in a digital phase locked loop circuit.

10. The apparatus of claim 9, wherein the binary arithmetic operation is performed in a loop filter.

11. The apparatus of claim 10, wherein the thermometer coded signal represents one or more thermometer codes used to control a digitally controlled oscillator (DCO), such that the DCO outputs a corrected clock signal that is useable to decode digital data received by a receiver.

12. The apparatus of claim 11, wherein an output of the loop filter is provided to a sigma delta encoder which generates a dithering signal useable by the DCO.

13. Apparatus for processing a binary coded signal to generate a thermometer coded signal for use in a digital phase locked loop circuit, comprising:

first processing logic for obtaining a binary coded input signal representative of an error; performing a binary arithmetic operation on a least significant bit (LSB) portion of the binary coded input signal; and generating at least one signal representative of an occurrence of one of an overflow condition and an underflow condition, in response to the binary arithmetic operation performed on the LSB portion; and second processing logic, coupled to the first processing logic, for shifting a thermometer coded signal in response to the signal representative of the occurrence of one of the overflow condition and the underflow condition, wherein shifting of the thermometer coded signal represents one of incrementing and decrementing a most significant bit (MSB) portion of the binary coded input signal; and outputting the thermometer coded signal.

14. The apparatus of claim 13, wherein performing the binary arithmetic operation on the LSB portion of the binary coded input signal and shifting the thermometer coded signal in response to one of the overflow condition and the underflow condition results in elimination of a sign extension into the MSB portion of the binary coded input signal.

15. The apparatus of claim 13, wherein the first processing logic comprises a digital loop filter.

16. The apparatus of claim 15, wherein the thermometer coded signal represents one or more thermometer codes used to control a digitally controlled oscillator (DCO), such that the DCO outputs a corrected clock signal that is useable to decode digital data received by a receiver.

17. The apparatus of claim 16, wherein an output of the digital loop filter is provided to a sigma delta encoder which generates a dithering signal useable by the DCO.

* * * * *